(12) United States Patent
Takata et al.

(10) Patent No.: US 12,175,045 B2
(45) Date of Patent: Dec. 24, 2024

(54) CAPACITANCE MEASUREMENT CIRCUIT MODULE

(71) Applicant: Alps Alpine Co., Ltd., Tokyo (JP)

(72) Inventors: Masahiro Takata, Miyagi-ken (JP); Hiroshi Shigetaka, Fukushima-ken (JP)

(73) Assignee: Alps Alpine Co., Ltd., Tokyo (JP)

( * ) Notice: Subject to any disclaimer, the term of this patent is extended or adjusted under 35 U.S.C. 154(b) by 0 days.

(21) Appl. No.: 18/586,202

(22) Filed: Feb. 23, 2024

(65) Prior Publication Data

US 2024/0302924 A1 Sep. 12, 2024

(30) Foreign Application Priority Data

Mar. 6, 2023 (JP) ................................ 2023-033932

(51) Int. Cl.
*G06F 3/044* (2006.01)

(52) U.S. Cl.
CPC .... *G06F 3/044* (2013.01); *G06F 2203/04107* (2013.01)

(58) Field of Classification Search
CPC .......... G06F 3/044; G06F 2203/04107; H05K 1/0277
See application file for complete search history.

(56) References Cited

U.S. PATENT DOCUMENTS

| 8,803,000 | B2 * | 8/2014 | Miyahara | H01G 11/04 |
| | | | | 174/260 |
| 2003/0052867 | A1 * | 3/2003 | Shigetaka | G06F 3/0446 |
| | | | | 345/173 |
| 2011/0018560 | A1 | 1/2011 | Kurashima | |
| 2013/0322032 | A1 * | 12/2013 | Shigetaka | G06F 3/041 |
| | | | | 156/60 |
| 2022/0291814 | A1 * | 9/2022 | Nakamura | G06F 3/0443 |

FOREIGN PATENT DOCUMENTS

JP 2011-028535 2/2011
WO WO-2021117446 A1 * 6/2021 ........... G06F 3/0416

OTHER PUBLICATIONS

WO2021/117446 (Year: 2021).*

* cited by examiner

*Primary Examiner* — Antonio Xavier
(74) *Attorney, Agent, or Firm* — Beyer Law Group LLP

(57) ABSTRACT

A capacitance measurement circuit module has: a sensor electrode, for input detection, disposed on a wiring board; a sensor-side shield electrode shielding the sensor electrode; board-side measurement terminals connected to the sensor electrode; a board-side shield terminal connected to the sensor-side shield electrode; a measurement integrated circuit having circuit-side measurement terminals connected to the board-side measurement terminals and a circuit-side shield terminal connected to the board-side shield terminal, the circuit outputting measurement signals from the circuit-side measurement terminals and outputting, from the circuit-side shield terminal, a shield signal having the same frequency and phase as the measurement signals, the circuit being disposed on the wiring board and measuring capacitance of the sensor electrode; and a circuit-side shield electrode that is positioned on the wiring board so as to face the measurement integrated circuit and to be adjacent to the board-side measurement terminals and is connected to the board-side shield terminal.

5 Claims, 6 Drawing Sheets

CAPACITANCE MEASUREMENT CIRCUIT MODULE

CLAIM OF PRIORITY

This application claims benefit of Japanese Patent Application No. 2023-033932 filed on Mar. 6, 2023, which is hereby incorporated by reference.

BACKGROUND OF THE INVENTION

1. Field of the Invention

The present disclosure relates to a capacitance measurement circuit module that measures capacitance.

2. Description of the Related Art

In a conventional capacitive input device, an integrated circuit (IC) chip is connected to first mounting terminals and a second mounting terminal, which are included in an input panel, through a flexible wiring board. A shield layer is formed for wires formed on the flexible wiring board connected to input position detection electrodes in the input panel. A shield potential is applied to the shield layer to achieve a state in which parasitic capacitance is not generated between the wires and the shield layer (see Japanese Unexamined Patent Application Publication No. 2011-028535, for example).

With the conventional capacitive input device, however, in the vicinity of the IC chip, there is no an active shield through which an alternate-current signal flows that has the same frequency and the same phase as an alternate-current component included in a signal supplied to the sensor electrode. Therefore, noise may be generated in wires or the like around the IC chip due to, for example, parasitic capacitance between the IC chip and wires around the IC chip.

SUMMARY OF THE INVENTION

In view of this, the present disclosure provides a capacitance measurement circuit module that can more reliably reduce the effect of noise.

A capacitance measurement circuit module in the present disclosure has: a wiring board; a sensor electrode for use for input detection, the sensor electrode being disposed on the wiring board; a sensor-side shield electrode that shields the sensor electrode, the sensor-side shield electrode being disposed on the wiring board; board-side measurement terminals connected to the sensor electrode, the board-side measurement terminals being disposed on the wiring board; a board-side shield terminal connected to the sensor-side shield electrode, the board-side shield terminal being disposed on the wiring board; a measurement integrated circuit having circuit-side measurement terminals connected to the board-side measurement terminals and also having a circuit-side shield terminal connected to the board-side shield terminal, the measurement integrated circuit outputting measurement signals from the circuit-side measurement terminals and also outputting a shield signal having the same frequency and the same phase as the measurement signals from the circuit-side shield terminal, the measurement integrated circuit being disposed on the wiring board, the measurement integrated circuit measuring capacitance of the sensor electrode; and a circuit-side shield electrode disposed at a position, on the wiring board, at which the circuit-side shield electrode faces the measurement integrated circuit and is adjacent to the board-side measurement terminals, the circuit-side shield electrode being connected to the board-side shield terminal.

The present disclosure can provide a capacitance measurement circuit module that can more reliably reduce the effect of noise.

DESCRIPTION OF THE PREFERRED EMBODIMENTS

An embodiment to which a capacitance measurement circuit module in the present disclosure is applied will be described below.

The description below is based on an XYZ coordinate system. A direction parallel to the X axis is an X direction. A direction parallel to the Y axis is a Y direction. A direction parallel to the Z axis is a Z direction. These directions are mutually orthogonal. The phrase "in plan view" will refer to an XY plane being viewed. In the description below, for easy understanding of the structure, the length, bulkiness, thickness, and the like of each portion may be indicated by being exaggerated.

Embodiment

Figure 1:
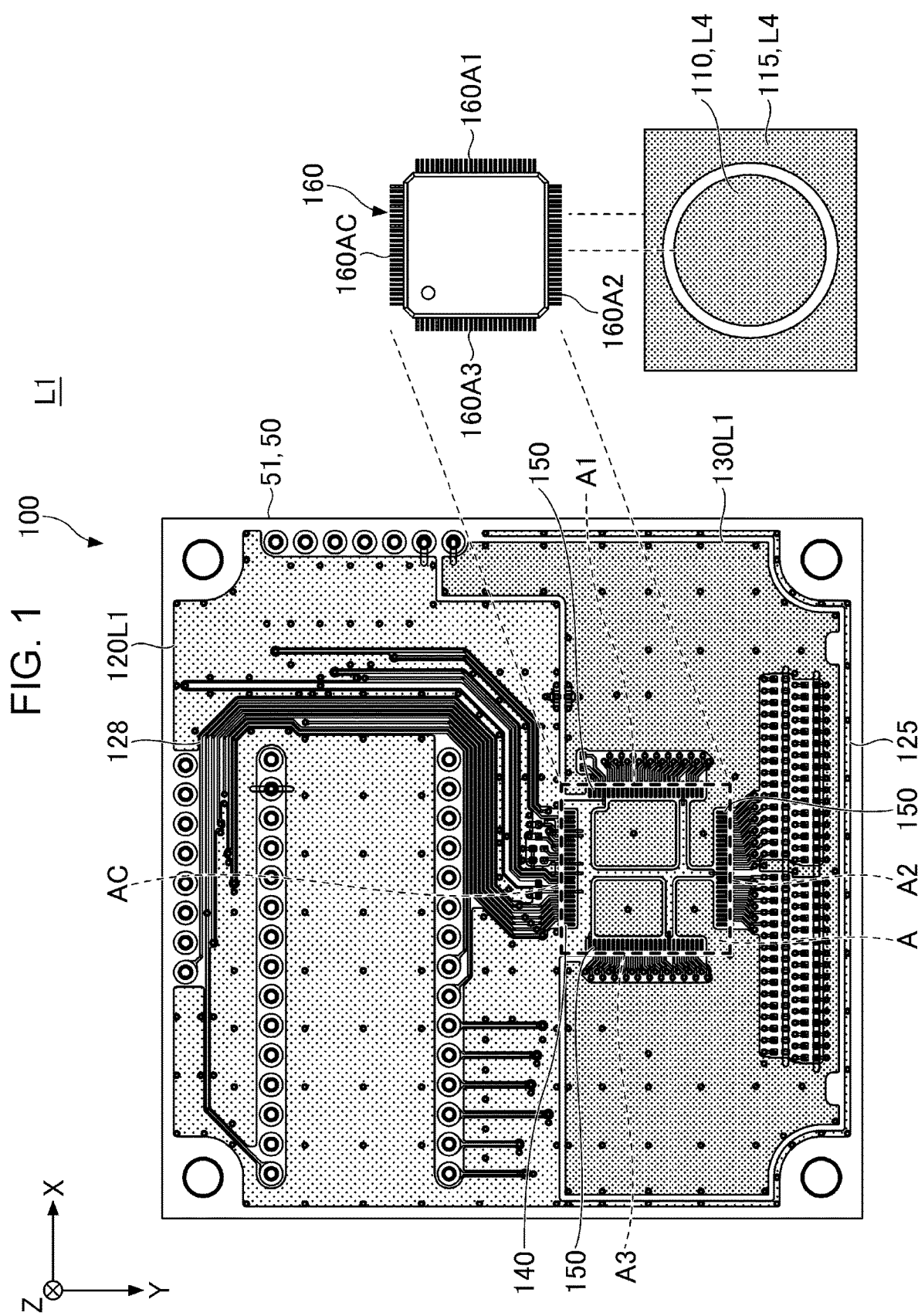
FIG. 1 illustrates an example of the structure of a layer in a capacitance measurement circuit module in an embodiment.

FIG. 1 illustrates an example of the structure of an L1 layer in a capacitance measurement circuit module 100 in an embodiment. The capacitance measurement circuit module 100 is, for example, a device that is incorporated into an input device at a landing of an elevator that is installed in a store, a facility, or the like and is used by general public, or is incorporated into an input device in the cage of the elevator of this type. Alternatively, the capacitance measurement circuit module 100 is a device incorporated into a tablet input device or into the input unit of an automatic teller machine (ATM). The capacitance measurement circuit module 100 incorporated into the input device or input unit measures capacitance between the capacitance measurement circuit module 100 and a target such as the hand of the user. The capacitance measurement circuit module 100 may be incorporated into the input unit of a cooking electric appliance that needs to be kept clean. Alternatively, the capacitance measurement circuit module 100 may be incorporated into an input device or the like in a tablet computer, a smart phone, a game machine, a center console in a vehicle, or the like that is used by an individual.

The capacitance measurement circuit module 100 includes a multi-layer circuit board 50, which is an example of a wiring board. The multi-layer circuit board 50 has one insulating layer or a plurality of insulating layers as well as a plurality of wiring layers. As an example, an aspect will be described here in which the multi-layer circuit board 50 includes four wiring layers denoted L1 to L4 and three insulating layers. In FIG. 1, a measurement integrated circuit (IC) chip 160 has been removed from the multi-layer circuit board 50; and a sensor electrode 110 and an active shield electrode 115, which are provided included in the L4 layer, are also indicated besides the structure of the L1 layer. In the description below, FIGS. 2 to 6 will also be referenced besides FIG. 1.

Figure 2:
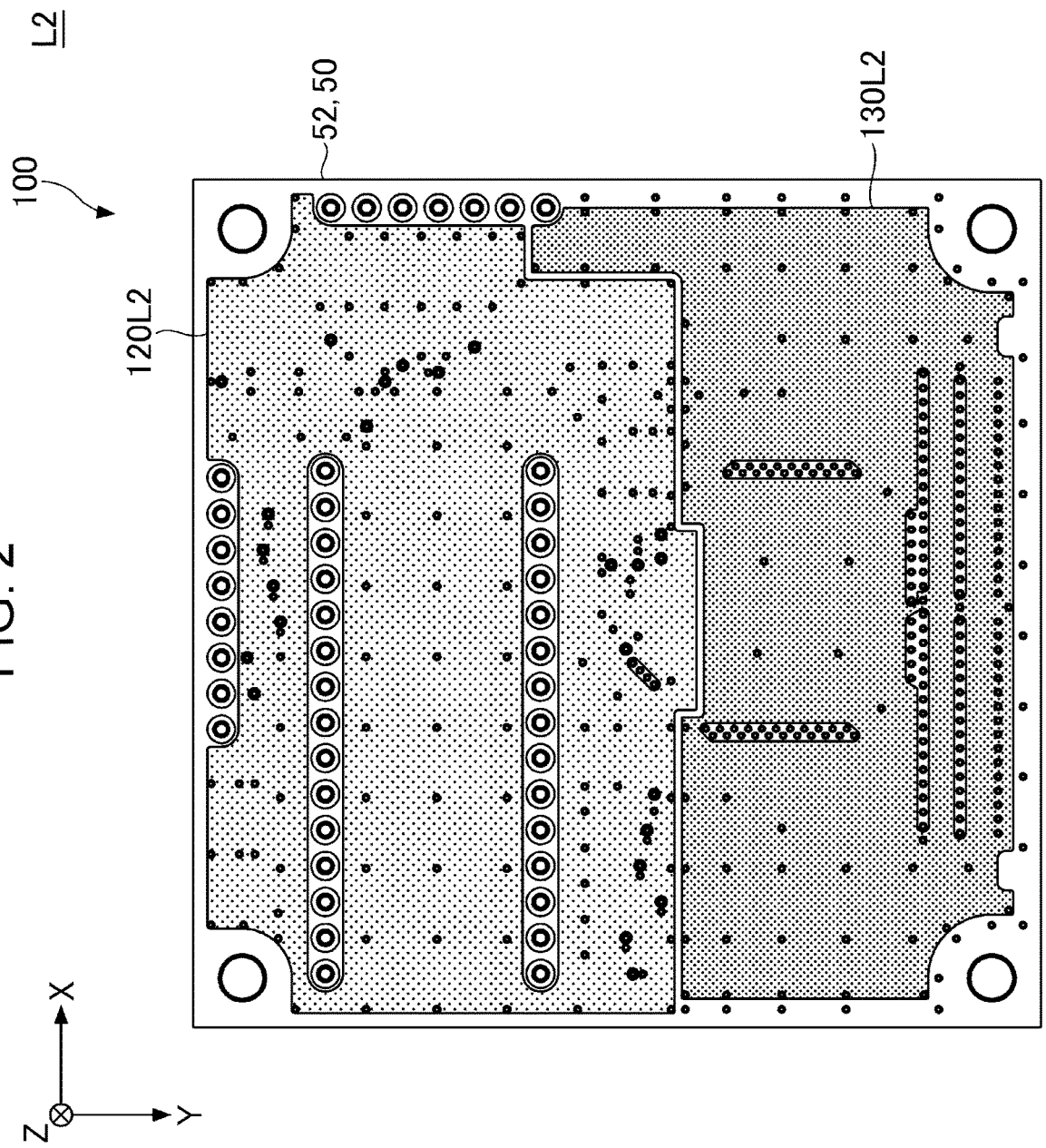
FIG. 2 illustrates an example of the structure of another layer in the capacitance measurement circuit module in the embodiment.

FIG. 2 illustrates an example of the structure of the L2 layer in the capacitance measurement circuit module 100. In FIG. 2, the L2 layer in the capacitance measurement circuit module 100 is positioned immediately below the L1 layer illustrated in FIG. 1. The structure, illustrated in FIGS. 1 and 2, of the capacitance measurement circuit module 100 may be the structure of part of the whole of the capacitance measurement circuit module 100.

Figure 3:
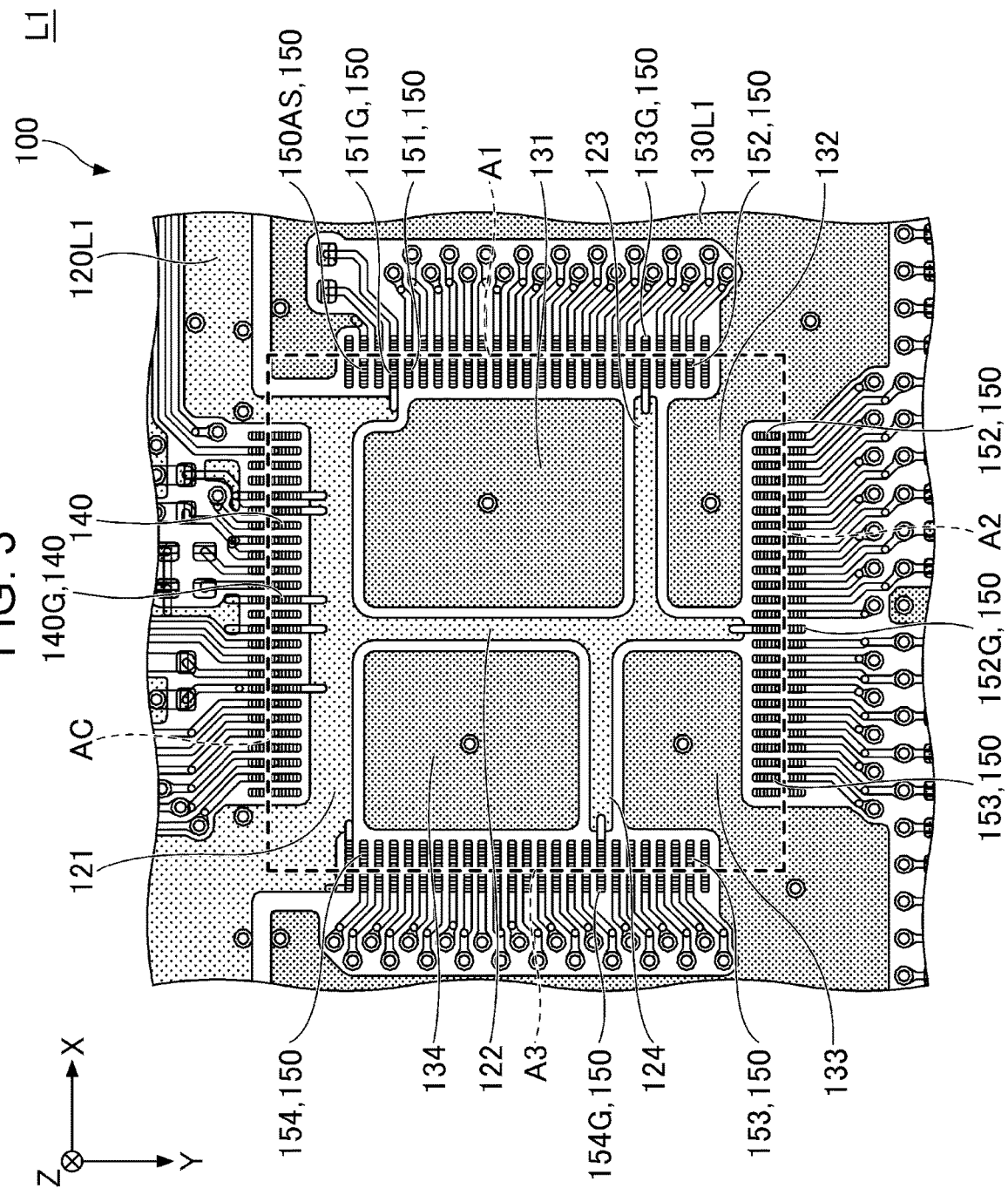
FIG. 3 is an enlarged view of the structure of an area indicated by being enclosed by a dashed quadrangle in FIG. 1.
Figure 4:
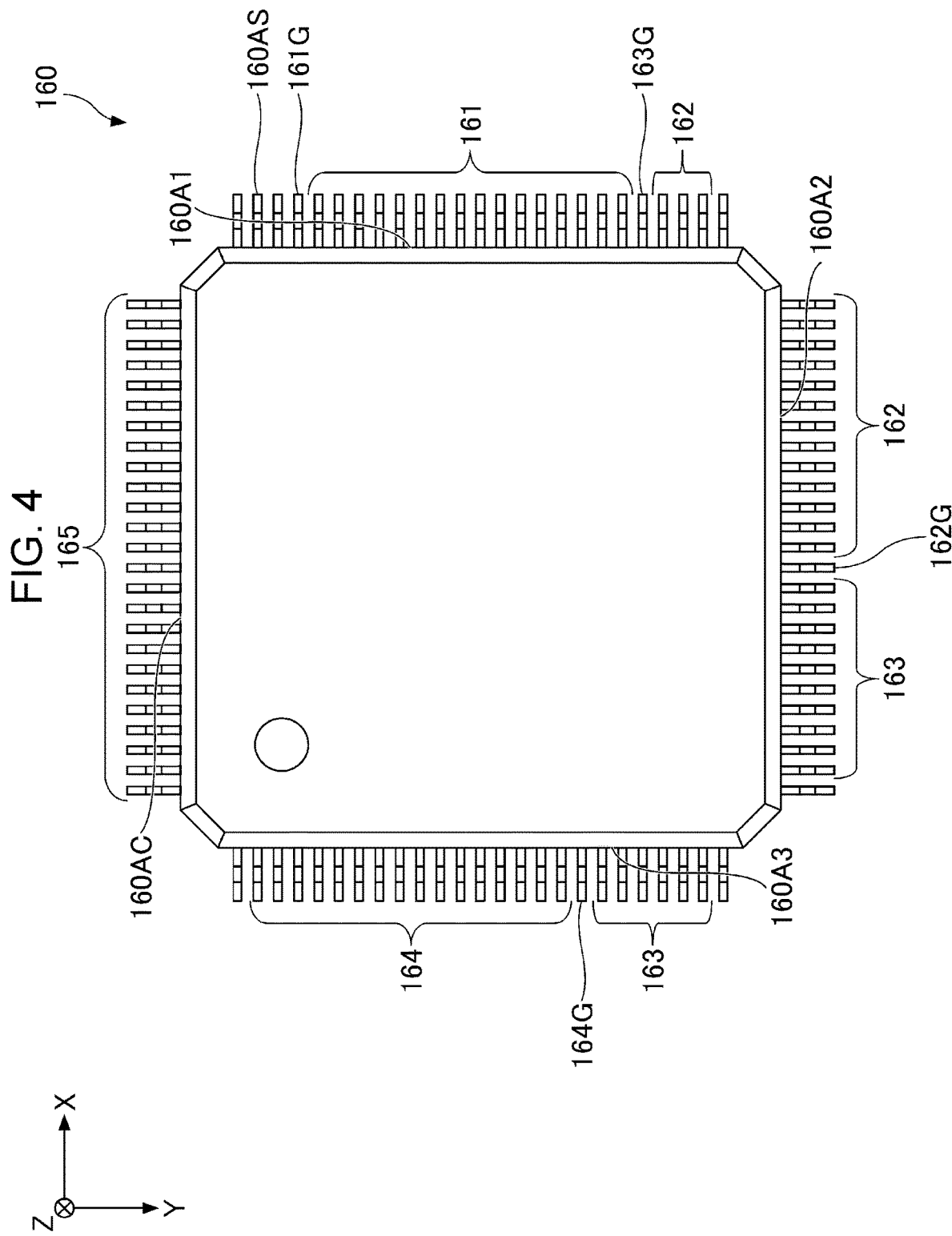
FIG. 4 illustrates an example of the structure of the top of a measurement IC chip in the capacitance measurement circuit module in the embodiment.
Figure 5:
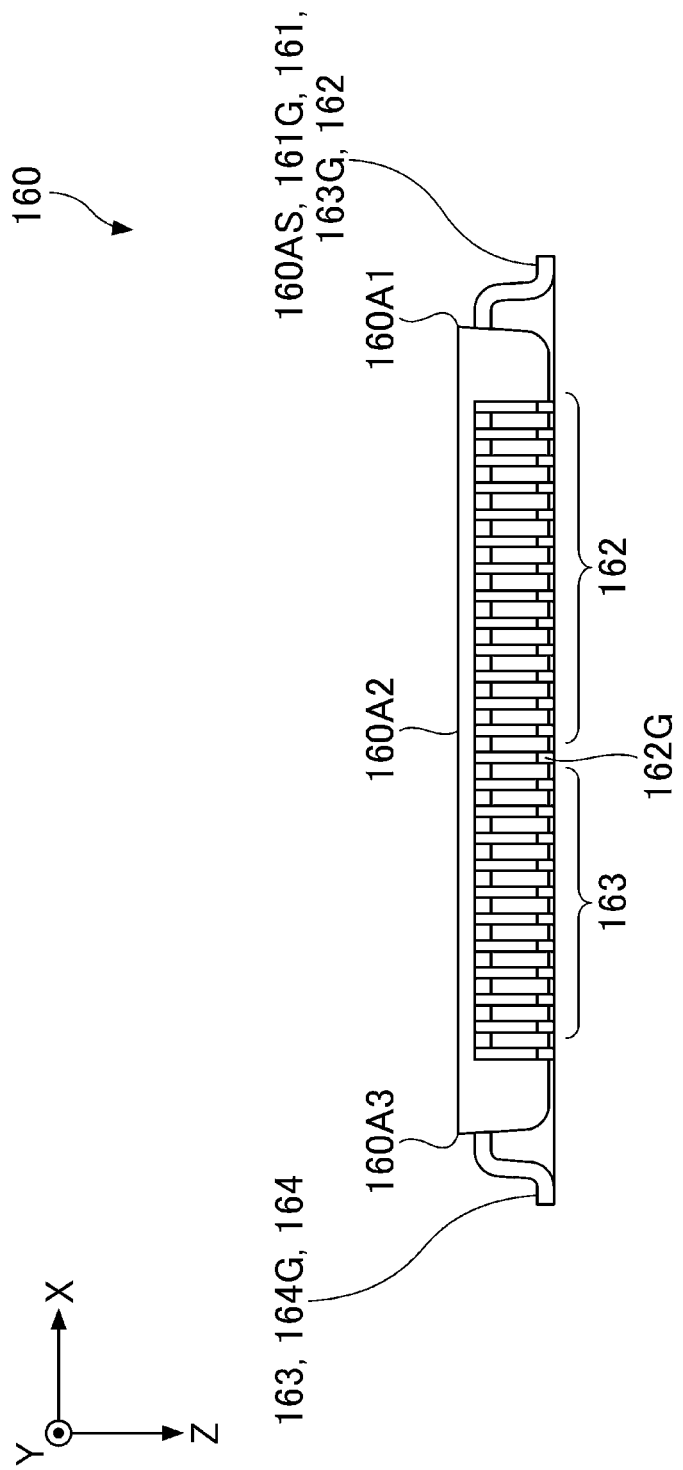
FIG. 5 illustrates an example of the structure of a side of the measurement IC chip in the capacitance measurement circuit module in the embodiment.

FIG. 3 is an enlarged view of the structure of an area A indicated by being enclosed by a dashed quadrangle in FIG. 1. At the L1 layer of the multi-layer circuit board 50, the measurement IC chip 160 is mounted in the area A. In other words, the area A is defined at a position at which the area A faces the measurement IC chip 160 on the multi-layer circuit board 50. FIG. 4 illustrates an example of the structure of the top of the measurement IC chip 160, and FIG. 5 illustrates an example of the structure of a side of the measurement IC chip 160. The measurement IC chip 160 is an example of a measurement integrated circuit. The area A is a rectangular area corresponding to the four sides of the measurement IC chip 160, which is rectangular in plan view.

In the description below, the four sides of the measurement IC chip 160 will be distinguished as follows. The measurement IC chip 160 has a control side 160AC, a first measurement side 160A1, a second measurement side 160A2, and a third measurement side 160A3. Of the four sides of the measurement IC chip 160, the first measurement side 160A1, second measurement side 160A2, and third measurement side 160A3 may be three measurement sides other than the control side 160AC. The control side 160AC is a side that is on the −Y-direction side of the measurement IC chip 160 and extends in the X direction. The first measurement side 160A1 is a side that is on the +X-direction side of the measurement IC chip 160 and extends in the Y direction. The second measurement side 160A2 is a side that is on the +Y-direction side of the measurement IC chip 160 and extends in the X direction. The third measurement side 160A3 is a side that is on the −X-direction side of the measurement IC chip 160 and extends in the Y direction.

The four sides of the area A, which are equivalent to the four sides of the measurement IC chip 160, will be referred to as a control side AC, which is equivalent to the control side 160 AC, a first measurement side A1, which is equivalent to the first measurement side 160A1, a second measurement side A2, which is equivalent to the second measurement side 160A2, and a third measurement side A3, which is equivalent to the third measurement side 160A3. When the measurement IC chip 160 is placed in the area A, the control side 160AC, first measurement side 160A1, second measurement side 160A2, and third measurement side 160A3 are respectively positioned at the control side AC, first measurement side A1, second measurement side A2, and third measurement side A3. In FIG. 1, the measurement IC chip 160 is illustrated with a positional offset from the area A. In the description below, however, the measurement IC chip 160 will be assumed to have been mounted in the area A.

<Structure of the Capacitance Measurement Circuit Module 100>

The capacitance measurement circuit module 100 includes ground electrodes 120L1 and 120L2, active shield electrodes 130L1 and 130L2, board-side terminals 140, and board-side terminals 150, besides the multi-layer circuit board 50, sensor electrode 110, active shield electrode 115, and measurement IC chip 160. The active shield electrode 115 is an example of a sensor-side shield electrode. The active shield electrodes 130L1 and 130L2 are each an example of a circuit-side shield electrode.

<Multi-Layer Circuit Board 50>

The multi-layer circuit board 50 has three insulating layers and four wiring layers denoted L1 to L4, as an example. Of the three insulating layers, an insulating layer 51 is illustrated in FIG. 1 and an insulating layer 52 is illustrated in FIG. 2. The L1 layer is disposed on the −Z-direction side of the insulating layer 51. The L2 layer is disposed between the insulating layers 51 and 52. The remaining one insulating layer (not illustrated) is disposed on the surface of the L3 layer in the +Z direction, the L3 layer being disposed on the surface of the insulating layer 52 in the +Z direction. The L4 layer is disposed on the surface of the remaining one insulating layer (not illustrated) in the +Z direction. The L1 layer is disposed on the surface of the multi-layer circuit board 50 in the −Z direction. The L2 layer and L3 layer are each an inner layer in the multi-layer circuit board 50. The L4 layer is disposed on the surface of the multi-layer circuit board 50 in the +Z direction.

The sensor electrode 110, active shield electrode 115, ground electrodes 120L1 and 120L2, active shield electrodes 130L1 and 130L2, board-side terminals 140, and board-side terminals 150 can be manufactured by pattering metal layers of the L1 layer to L4 layer in the multi-layer circuit board 50. As the metal layer, a copper foil or the like can be used as an example.

<Sensor Electrode 110>

The Sensor Electrode 110 Is Included In The L4 Layer As An Example. The Sensor electrode 110 detects an input to the capacitance measurement circuit module 100. The sensor electrode 110 is connected to the measurement IC chip 160 through a through-hole via, a wire, or the like that passes through the insulating layers between the L1 layer and the L4 layer. The sensor electrode 110 is driven by a signal including an alternate-current component having the same frequency and the same phase as alternate-current components included in signals supplied to active shield electrode 115 and the active shield electrodes 130L1 and 130L2.

The sensor electrode 110 is circular in plan view, as an example. Although, as an example, only one sensor electrode 110 is illustrated in FIG. 1, the capacitance measurement circuit module 100 may be structured so as to include two or more sensor electrodes 110. When, for example, the capacitance measurement circuit module 100 is incorporated into an input device (manipulation unit) attached in an elevator cage to select a stop floor, the capacitance measurement circuit module 100 only needs to include as many sensor electrodes 110 as there are floors in the building in which the elevator is installed. The capacitance measurement circuit module 100 only needs to be structured so as to include at least one sensor electrode 110 of this type. The capacitance measurement circuit module 100 measures capacitance Crg between the sensor electrode 110 and a target (hand H).

<Active Shield Electrode 115>

The active shield electrode 115 encloses the sensor electrode 110 in plan view at the L4 layer. The active shield electrode 115 is formed from a metal layer without clearances. That is, the active shield electrode 115 is a metal layer formed as substantially the whole surface of the L4 layer except a portion in which the sensor electrode 110 is disposed. In other words, the active shield electrode 115 is formed so as to fill portions of the L4 layer other than portions in which a plurality of sensor electrodes 110 are disposed.

The active shield electrode 115 is connected to a circuit-side shield terminal 160AS of the measurement IC chip 160 through a through-hole via, a wire, or the like that passes through the insulating layers between the L1 layer and the L4 layer. The active shield electrode 115 is also connected to the active shield electrode 130L1 included in the L1 layer through a through-hole via, a wire, or the like that passes through the insulating layers between the L1 layer and the L4 layer and to the active shield electrode 130L2 included in the L2 layer through a through-hole via, a wire, or the like that passes through the insulating layers between the L2 layer and the L4 layer.

The active shield electrode 115 is driven by a signal including an alternate-current component having the same frequency and the same phase as an alternate-current component included in a signal supplied to the sensor electrode 110. The alternate-current component in the signal supplied to the active shield electrode 115 has a larger amplitude than the alternate-current component in the signal supplied to the sensor electrode 110.

The active shield electrode 115 is provided to shield a plurality of sensor electrodes 110 from noise and to suppress the effect of parasitic capacitance. The active shield electrode 115 is placed in the vicinity of the plurality of sensor electrodes 110 with a predetermined spacing between the active shield electrode 115 and the plurality of sensor electrodes 110 so that the plurality of sensor electrodes 110 can be shielded from noise coming mainly from a ground potential point such as on a ground surface and that the effect of parasitic capacitance with respect to the ground potential point can be suppressed.

<Ground Electrode 120L1>

The ground electrode 120L1 is disposed in almost a half of the L1 layer mainly on the −Y-direction side, as illustrated in FIG. 1. In the Y direction, most of the ground electrode 120L1 is disposed more on the −Y-direction side with respect to the area A. Part of the ground electrode 120L1 is disposed in and in the vicinity of the area A.

The ground electrode 120L1 is separated from other wires and the like and is connected to the ground (earth) in a power supply unit (not illustrated). Wires 128 are disposed in an area in which part of the ground electrode 120L1, the part being more on the −Y-direction side with respect to the area A, is disposed in such a way that the wires 128 are insulated from the ground electrode 120L1. Part of the wires 128 is connected to board-side terminals 140.

The ground electrode 120L1 is formed from a metal layer without clearances. That is, the ground electrode 120L1 is a metal layer formed as the whole surface of portions in which other wires, terminals, and the like are not present. In other words, the ground electrode 120L1 is formed so as to fill portions other than portions in which other wires, terminals, and the like are disposed.

The ground electrode 120L1 has a first ground electrode portion 121, a second ground electrode portion 122, a third ground electrode portion 123, and a fourth ground electrode portion 124, as portions disposed in and in the vicinity of the area A. The first ground electrode portion 121 extends in the X direction along the control side AC of the area A. The first ground electrode portion 121, second ground electrode portion 122, third ground electrode portion 123, and fourth ground electrode portion 124 will be described later in detail.

The ground electrode 120L1 also includes a wire 125 disposed along outer edges of the insulating layer 51 on the L1 layer, as illustrated in FIG. 1. The wire 125 extends from a corner of the ground electrode 120L1 on the −X-direction side in the +Y direction near to another corner of the ground electrode 120L1 on the +X-direction side in the +Y direction along outer edges of the insulating layer 51 so as to enclose the active shield electrode 130L1. The wire 125 can be used to take countermeasures against static electricity.

<Ground Electrode 120L2>

The ground electrode 120L2 is disposed in almost a half of the L2 layer on the −Y-direction side, as illustrated in FIG. 2. The shape of the ground electrode 120L2 in plan view is substantially the same as the shape of a portion of the ground electrode 120L1 other than the first ground electrode portion 121 to the fourth ground electrode portion 124 and the wire 125. The ground electrode 120L2 is connected to the ground (earth) in the power supply unit (not illustrated) through a through-hole via passing through the insulating layer 51 between the L1 layer and the L2 layer, as with the ground electrode 120L1.

<Active Shield Electrode 130L1>

The active shield electrode 130L1 is disposed at the L1 layer as illustrated in FIG. 1. Specifically, the active shield electrode 130L1 is disposed in substantially the whole of a portion of the L1 layer other than the portion in which the ground electrode 120L1 is disposed.

The active shield electrode 130L1 is connected to the circuit-side shield terminal 160AS of the measurement IC chip 160. The active shield electrode 130L1 is provided to reduce the effect of noise or parasitic capacitance on the board-side terminals 150 and to reduce the effect of noise or parasitic capacitance on wires or the like included in the measurement IC chip 160.

The active shield electrode 130L1 is disposed in, for example, a portion that encloses three sides, +X-direction side, +Y-direction side and −X-direction side, of the area A in plan view as well as a portion of the area A other than an end of the area A on the −Y-direction side.

The portion, of the active shield electrode 130L1, that encloses the three sides, +X-direction side, +Y-direction side and −X-direction side, of the area A in plan view is a portion that encloses the first measurement side A1, second measurement side A2, and third measurement side A3 of the area A. First board-side measurement terminals 151 to fourth board-side measurement terminals 154 are disposed at the positions of the first measurement side A1, second measurement side A2, and third measurement side A3 of the area A. First circuit-side measurement terminals 161 to fourth circuit-side measurement terminals 164 disposed at the first measurement side 160A1, second measurement side 160A2, and third measurement side 160A3 of the measurement IC chip 160 are connected to the first board-side measurement terminal 151 to the fourth board-side measurement terminal 154.

A plurality of first circuit-side measurement terminals 161 are an example of a first circuit-side measurement terminal group. A plurality of second circuit-side measurement terminals 162 are an example of a second circuit-side measurement terminal group. A plurality of third circuit-side measurement terminals 163 are an example of a third circuit-side measurement terminal group. A plurality of fourth circuit-side measurement terminals 164 are an example of a fourth circuit-side measurement terminal group.

Since the first board-side measurement terminal 151 to the fourth board-side measurement terminal 154 are connected to the sensor electrode 110 through the multi-layer circuit board 50, the first board-side measurement terminal 151 to the fourth board-side measurement terminal 154 and the first circuit-side measurement terminal 161 to the fourth circuit-side measurement terminal 164 transmit sensor signals obtained from the sensor electrode 110.

The portion, of the active shield electrode 130L1, that encloses the three sides, +X-direction side, +Y-direction side and −X-direction side, of the area A in plan view is provided to reduce noise that comes from a ground potential point and is present around the first board-side measurement terminal 151 to the fourth board-side measurement terminal 154 and the first circuit-side measurement terminal 161 to the fourth circuit-side measurement terminal 164 and to reduce the effect of parasitic capacitance with respect to the ground potential point.

The active shield electrode 130L1 also has a first shield portion 131 to a fourth shield portion 134 in the area A, as will be described later in detail.

<Active Shield Electrode 130L2>

The active shield electrode 130L2 is disposed in substantially the whole of a portion of the L2 layer other than the portion in which the ground electrode 120L2 is disposed, as illustrated in FIG. 2.

The active shield electrode 130L2 is connected to the circuit-side shield terminal 160AS of the measurement IC chip 160. The active shield electrode 130L2 is provided to reduce the effect of noise from the sensor electrode 110 included in the L4 layer, an IC chip included in the L4 layer to drive the sensor electrode 110, and the like. The active shield electrode 130L2 only needs to be disposed at a position at which the active shield electrode 130L2 overlaps any one of the sensor electrode 110, the IC chip to drive the sensor electrode 110, and the like, as an example.

<Board-Side Terminal 140>

A plurality of board-side terminals 140 are aligned along the control side AC of the area A in the X direction. The board-side terminals 140 are enclosed by the first ground electrode portion 121. Circuit-side terminals 165 of the measurement IC chip 160 are connected to the board-side terminals 140. The circuit-side terminals 165 include a power supply terminal, an output terminal, a control terminal, and a circuit-side ground terminal. Therefore, the board-side terminals 140 include a power supply terminal, an input terminal, a control terminal, and a board-side ground terminal 140G in correspondence to the power supply terminal, output terminal, control terminal, and circuit-side ground terminal categorized as circuit-side terminals 165. The power supply terminal, output terminal, control terminal, and circuit-side ground terminal categorized as circuit-side terminals 165 are respectively connected to the power supply terminal, input terminal, control terminal, board-side ground terminal 140G categorized as board-side terminals 140.

The input terminal categorized as a board-side terminal 140 receives a sensor signal that represents the value of the capacitance of the sensor electrode 110. The control terminal categorized as a board-side terminal 140 outputs a digital signal that controls the measurement IC chip 160 and also receives a digital signal from the measurement IC chip 160. The power supply terminal categorized as a board-side terminal 140 receives electric power from the multi-layer circuit board 50. The board-side ground terminal 140G categorized as a board-side terminal 140 is connected to the ground electrode 120L1 and ground electrode 120L2 of the multi-layer circuit board 50.

The periphery of the board-side terminals 140 of this type is enclosed by the ground electrode 120L1. Therefore, the effect of noise or the like on the power supply terminal, input terminal, control terminal, board-side ground terminal 140G categorized as board-side terminals 140 is reduced by the ground electrode 120L1.

<Board-Side Terminal 150>

The board-side terminals 150 include first board-side measurement terminals 151 to the fourth board-side measurement terminals 154, which transmit sensor signals coming from the sensor electrode 110 as well as board-side ground terminals 151G to 154G and a board-side shield terminal 150AS, as illustrated in FIG. 3. As an example, 16 first board-side measurement terminals 151, 16 second board-side measurement terminals 152, 16 third board-side measurement terminals 153, and 16 fourth board-side measurement terminals 154 are provided. The plurality of first board-side measurement terminals 151 are an example of a first board-side measurement terminal group. The plurality of second board-side measurement terminals 152 are an example of a second board-side measurement terminal group. The plurality of third board-side measurement terminals 153 are an example of a third board-side measurement terminal group. The plurality of fourth board-side measurement terminals 154 are an example of a fourth board-side measurement terminal group.

Each of the first board-side measurement terminals 151 to the fourth board-side measurement terminals 154, the total number of which is 64, is connected to, for example, one sensor electrode 110 through the multi-layer circuit board 50. That is, a maximum of 64 sensor electrodes 110 can be mounted in the capacitance measurement circuit module 100. When the number of sensor electrodes 110 included in the capacitance measurement circuit module 100 is smaller than 64, out of the 64 first board-side measurement terminals 151 to fourth board-side measurement terminals 154, the sensor electrodes 110 are connected to only as many first board-side measurement terminals 151 to fourth board-side measurement terminals 154 as there are sensor electrodes 110. The remaining first board-side measurement terminals 151 to fourth board-side measurement terminals 154 are left unused. A plurality of sensor electrodes 110 can be selectively connected to each of the 64 first board-side measurement terminals 151 to fourth board-side measurement terminals 154 through a switching switch. A connection relationship will be described below in a case in which 64 sensor electrodes 110 are connected to the 64 first board-side measurement terminals 151 to fourth board-side measurement terminals 154 included in the capacitance measurement circuit module 100.

The board-side terminals 150 are disposed along the first measurement side A1 to third measurement side A3 of the area A as illustrated in FIG. 3.

The board-side shield terminal 150AS is disposed at an end of the first measurement side A1 in the −Y direction. The board-side shield terminal 150AS is connected to the circuit-side shield terminal 160AS at the first measurement side 160A1 of the measurement IC chip 160.

A board-side terminal 150 next to the board-side shield terminal 150AS in the −Y direction is a dummy terminal, which is not connected to any destination. The board-side terminals 150 include some dummy terminals. A board-side terminal 150 next to the board-side shield terminal 150AS in the +Y direction is a power supply terminal. This power supply terminal is connected to a power supply terminal at the first measurement side 160A1 of the measurement IC chip 160.

The board-side ground terminal 151G is disposed next, in the +Y direction, to the power supply terminal next to the board-side shield terminal 150AS in the +Y direction. The board-side ground terminal 151G is connected to the ground (earth) in the power supply unit (not illustrated). The board-side ground terminal 151G is connected to a circuit-side ground terminal 161G at the first measurement side 160A1 of the measurement IC chip 160.

At the first measurement side A1, all the 16 first board-side measurement terminals 151 are aligned on the +Y-direction side of the board-side ground terminal 151G. The board-side ground terminal 153G is disposed next, in the +Y direction, to the extreme-end first board-side measurement terminal 151 in +Y direction. The first board-side measurement terminals 151 are connected to the 16 first circuit-side measurement terminals 161 at the first measurement side 160A1 of the measurement IC chip 160. The board-side ground terminal 153G is connected to a circuit-side ground terminal 163G at the first measurement side 160A1 of the measurement IC chip 160.

At the first measurement side A1, three of the 16 second board-side measurement terminals 152 are aligned on the +Y-direction side of the board-side ground terminal 153G. Also at the first measurement side A1, the board-side terminal 150 next, in the +Y direction, to the extreme-end second board-side measurement terminal 152 in +Y direction is a dummy terminal, which is not connected to any destination. The three second board-side measurement terminals 152 are connected to three second circuit-side measurement terminals 162 at the first measurement side 160A1 of the measurement IC chip 160.

The remaining 13 second board-side measurement terminals 152 are aligned at the second measurement side A2, starting from the +X-direction side. The board-side ground terminal 152G is disposed next, in the −X direction, to the extreme-end second board-side ground terminal 152 in the −X direction. The 13 second board-side measurement terminals 152 are connected to the 13 second circuit-side measurement terminals 162 at the second measurement side 160A2 of the measurement IC chip 160. The board-side ground terminal 152G is connected to a circuit-side ground terminal 162G at the second measurement side 160A2 of the measurement IC chip 160.

At the second measurement side A2, 10 of the 16 third board-side measurement terminals 153 are aligned on the −X-direction side of the board-side ground terminal 152G. The board-side terminal 150 next, in the −X direction, to the extreme-end third board-side measurement terminals 153 in −X direction is a dummy terminal, which is not connected to any destination. The 10 third board-side measurement terminals 153 are connected to 10 third circuit-side measurement terminals 163 at the second measurement side 160A2 of the measurement IC chip 160.

The remaining six third board-side measurement terminals 153 are aligned at the third measurement side A3, starting from the +Y-direction side. The board-side terminal 150 next, in the +Y direction, to the extreme-end third board-side measurement terminal 153 in the +Y direction is a dummy terminal, which is not connected to any destination. The board-side ground terminal 154G is disposed next, in the −Y direction, to the extreme-end third board-side measurement terminal 153 in the −Y direction. The six third board-side measurement terminals 153 are connected to the third circuit-side measurement terminals 163 at the third measurement side 160A3 of the measurement IC chip 160. The board-side ground terminal 154G is connected to a circuit-side ground terminal 164G at the third measurement side 160A3 of the measurement IC chip 160.

At the third measurement side A3, all the 16 fourth board-side measurement terminals 154 are aligned on the −Y-direction side of the board-side ground terminal 154G. The first ground electrode portion 121 is disposed next, in the −Y direction, to the extreme-end fourth board-side measurement terminal 154 in-Y direction. The 16 fourth board-side measurement terminals 154 are connected to the 16 fourth circuit-side measurement terminals 164 at the third measurement side 160A3 of the measurement IC chip 160.

<Measurement IC Chip 160>

The measurement IC chip 160 has the control side 160AC and the first measurement side 160A1 to third measurement side 160A3, as illustrated in FIG. 4. The measurement IC chip 160 has a plurality of circuit-side terminals 165 at the control side 160AC. The circuit-side terminals 165 include a power supply terminal, an output terminal, a control terminal, and a circuit-side ground terminal. Each circuit-side terminal 165 is connected to the relevant board-side terminal 140.

At the first measurement side 160A1, the measurement IC chip 160 has the circuit-side shield terminal 160AS, the circuit-side ground terminal 161G, the 16 first circuit-side measurement terminals 161, the circuit-side ground terminal 163G, and three second circuit-side measurement terminals 162. These terminals are connected to the multi-layer circuit board 50 as described above. The circuit-side shield terminal 160AS, circuit-side ground terminal 161G, first circuit-side measurement terminals 161, circuit-side ground terminal 163G, and second circuit-side measurement terminals 162 are bent in the +Z direction in the middle of extending from the upper surface side of the measurement IC chip 160 toward the +X-direction side, as illustrated in FIG. 5, after which the ends of the bent portions are connected to the multi-layer circuit board 50.

At the second measurement side 160A2, the measurement IC chip 160 has 13 second circuit-side measurement terminals 162, the circuit-side ground terminal 162G, and 10 third circuit-side measurement terminals 163. These terminals are connected to the multi-layer circuit board 50 as described above. The shapes of the second circuit-side measurement terminal 162, circuit-side ground terminal 162G, and third circuit-side measurement terminal 163 at the second measurement side 160A2 when viewed from their sides are similar to the shapes of the circuit-side shield terminal 160AS, circuit-side ground terminal 161G, first circuit-side measurement terminal 161, circuit-side ground terminal 163G, and second circuit-side measurement terminal 162, illustrated in FIG. 5, at the first measurement side 160A1 when viewed from their sides.

At the third measurement side 160A3, the measurement IC chip 160 has six third circuit-side measurement terminals 163, the circuit-side ground terminal 164G, and the 16 fourth circuit-side measurement terminals 164. These terminals are connected to the multi-layer circuit board 50 as described above. The third circuit-side measurement terminals 163, circuit-side ground terminal 164G, and fourth circuit-side measurement terminals 164 are bent in the +Z direction in the middle of extending from the upper surface side of the measurement IC chip 160 toward the −X-direction side, as illustrated in FIG. 5, after which the ends of the bent portions are connected to the multi-layer circuit board 50.

The measurement IC chip 160 is included in the L1 layer as an example. The measurement IC chip 160 is connected to the sensor electrode 110, and active shield electrode 115, and active shield electrodes 130L1 and 130L2 through wires, through-hole vias, or the like included in the multi-layer circuit board 50.

The measurement IC chip 160 supplies measurement signals including alternate-current components having the same frequency and the same phase to the sensor electrode 110, active shield electrode 115, and active shield electrodes 130L1 and 130L2 to drive these electrodes. The alternate-current components in the signals supplied from the measurement IC chip 160 to the active shield electrode 115 and active shield electrodes 130L1 and 130L2 have larger amplitudes than the signal supplied from the measurement IC chip 160 to the sensor electrode 110.

When the measurement IC chip 160 supplies measurement signals including alternate-current components to the 64 sensor electrodes 110, the measurement IC chip 160 may output these measurement signals to the group of first circuit-side measurement terminals 161 to the group of fourth circuit-side measurement terminals 164 at different times and may output these measurement signals to a plurality of first circuit-side measurement terminals 161, second circuit-side measurement terminals 162, third circuit-side measurement terminals 163, or fourth circuit-side measurement terminals 164 in each group at the same time.

Since the measurement IC chip 160 supplies signals including alternate-current components of this type to the sensor electrodes 110, active shield electrode 115, and active shield electrodes 130L1 and 130L2 to drive these electrodes, the measurement IC chip 160 shields the plurality of sensor electrodes 110 and wires and the like in the measurement IC chip 160 from noise coming mainly from a ground potential point such as on a ground surface and suppresses the effect of parasitic capacitance with respect to the ground potential point.

In this way, the measurement IC chip 160 shields the plurality of sensor electrodes 110 and wires and the like in the measurement IC chip 160 from noise coming mainly from a ground potential point such as on a ground surface and suppresses the effect of parasitic capacitance with respect to the ground potential point. In this state, the measurement IC chip 160 decides the extent to which the support body such as the hand of the manipulator has approached the sensor electrode 110 according to the capacitance of the sensor electrode 110 to make a decision about the state of a manipulation input. Examples of the state of an manipulation input include a state in which the hand has come into contact with the manipulation surface, a state in which the hand has approached the manipulation surface to a certain extent but has not come into contact with the manipulation surface, and a state in which the hand is sufficiently distant from the manipulation surface.

<Circuit Structure of the Capacitance Measurement Circuit Module 100>

Figure 6:
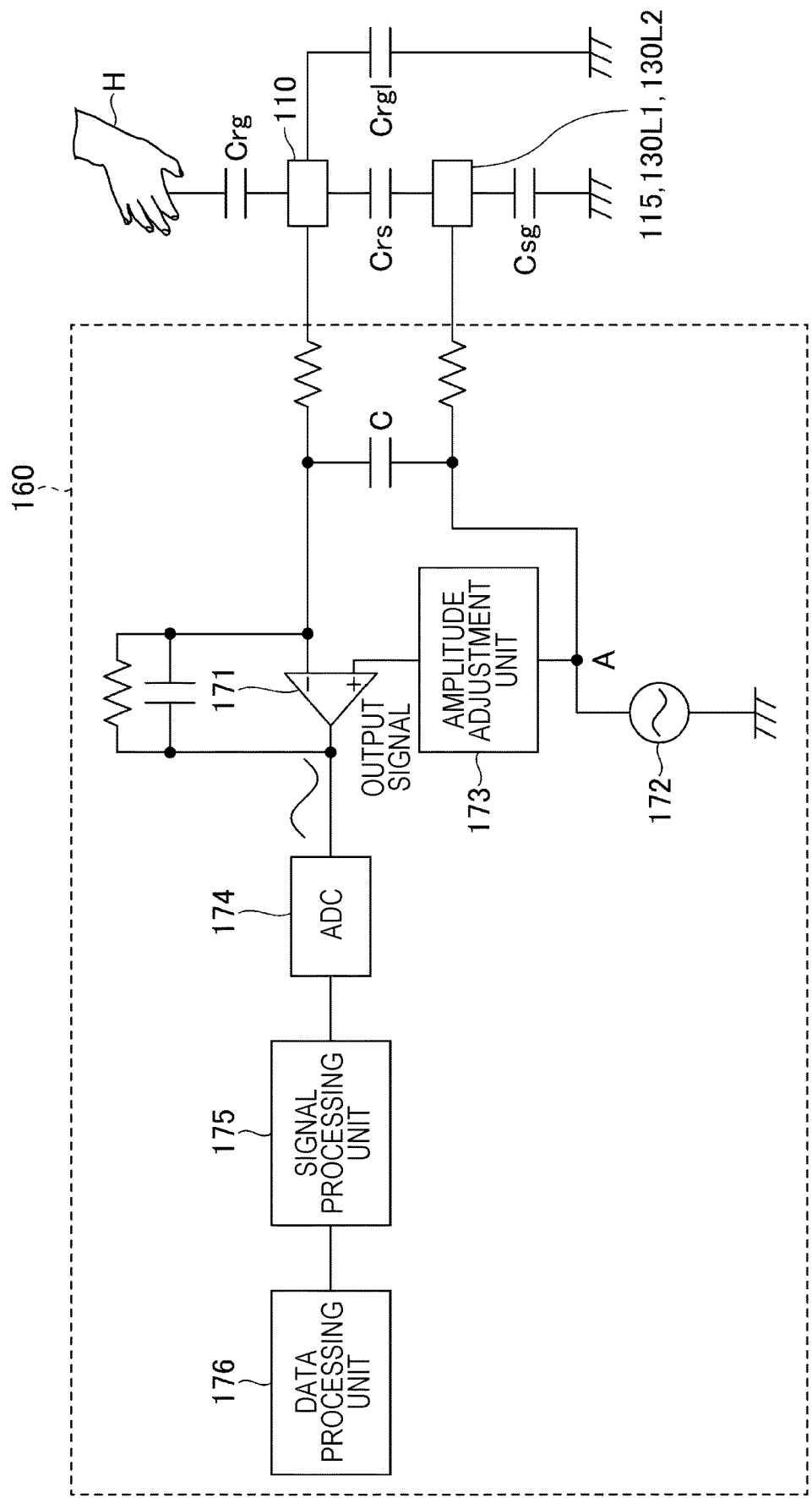
FIG. 6 illustrates an example of the circuit structure of the capacitance measurement circuit module in the embodiment.

FIG. 6 illustrates an example of the circuit structure of the capacitance measurement circuit module 100. As illustrated in FIG. 6, the sensor electrode 110, active shield electrode 115, and active shield electrodes 130L1 and 130L2 are connected to the measurement IC chip 160.

The measurement IC chip 160 has a charge amplifier 171, an alternate-current signal source 172, an amplitude adjustment unit 173, an analog-to-digital converter (ADC) 174, a signal processing unit 175, and a data processing unit 176.

The alternate-current signal source 172 outputs alternate-current signals that drive the active shield electrode 115 and active shield electrodes 130L1 and 130L2. The active shield electrode 115 and active shield electrodes 130L1 and 130L2 are electromagnetically coupled to the sensor electrode 110 and are also connected to it through a negative feedback circuit in the charge amplifier 171. Therefore, an alternate-current signal is supplied to the sensor electrode 110 as well. The alternate-current signals supplied to the sensor electrode 110, active shield electrode 115, and active shield electrodes 130L1 and 130L2 have the same frequency and the same phase. However, the alternate-current component in the signal supplied to the sensor electrode 110 has a smaller amplitude than the alternate-current component in the signal supplied to the active shield electrode 115.

The charge amplifier 171 has a non-inverting input terminal (+) connected to the output terminal of the amplitude adjustment unit 173, an inverting input terminal (−) connected to the sensor electrode 110, and an output terminal to the input terminal of the ADC 174. The charge amplifier 171 is a differential amplifier that amplitudes the difference in voltage between an input at the non-inverting input terminal (+) and an input at the inverting input terminal (−), and outputs the resulting output signal.

The amplitude adjustment unit 173 makes an adjustment so that two currents are offset by each other, one of which flows from the active shield electrode 115 through a capacitor Crs into the sensor electrode 110 and the other of which flows from the sensor electrode 110 through a parasitic capacitor Crgl into the ground. That is, in a state in which the hand H, which is a target that approaches the sensor electrode 110 (a state in which the capacitance of the capacitor Crs is zero), the amplitude is adjusted so that a driving current flowing in the sensor electrode 110 becomes zero. The ADC 174 converts a signal output from the charge amplifier 171 to digital form and outputs the converted signal to the signal processing unit 175. The signal processing unit 175 uses a demodulation signal having the same frequency as the alternate-current signal to demodulate the output from the ADC 174, and sends the resulting signal to the data processing unit 176. The data processing unit 176 decides whether a touch to the sensor electrode 110 or another manipulation has been performed, according the output from the signal processing unit 175.

<Structures of the First Ground Electrode Portion 121 to the Fourth Ground Electrode Portion 124>

The first ground electrode portion 121 may be present at a position at which the first ground electrode portion 121 faces the measurement IC chip 160 on the multi-layer circuit board 50 so as to extend in the X direction along the control side 160AC, as illustrated in FIGS. 1 and 3. The first ground electrode portion 121 has board-side terminals 140. The circuit-side terminals 165 of the measurement IC chip 160, including the power supply terminal, output terminal, control terminal, and circuit-side ground terminal, are connected to the board-side terminals 140. The first ground electrode portion 121 is provided to reduce noise or the like around the board-side terminals 140 and circuit-side terminals 165.

The second ground electrode portion 122 extends from the central portion of the first ground electrode portion 121 in the X direction in parallel to the first measurement side 160A1 and third measurement side 160A3, and is connected to the board-side ground terminal 152G. The circuit-side ground terminal 162G is connected to the board-side ground terminal 152G. That is, the second ground electrode portion 122 may extend from the central portion of the first ground electrode portion 121 in the X direction in parallel to the first measurement side 160A1 and third measurement side 160A3 toward between second circuit-side measurement terminals 162 and third circuit-side measurement terminals 163, and may be connected to the circuit-side ground terminal 162G between second circuit-side measurement terminals 162 and third circuit-side measurement terminals 163.

The third ground electrode portion 123 extends from an intermediate point of the second ground electrode portion 122 in parallel to the control side 160AC and second measurement side 160A2 toward the +X-direction side, and is connected to the board-side ground terminal 153G. The circuit-side ground terminal 163G is connected to the board-side ground terminal 153G. That is, the third ground electrode portion 123 may extend from an intermediate point of the second ground electrode portion 122 in the X direction in parallel to the control side 160AC and second measurement side 160A2 toward between first circuit-side measurement terminals 161 and second circuit-side measurement terminals 162, and may be connected to the circuit-side ground terminal 163G.

The fourth ground electrode portion 124 extends from an intermediate point of the second ground electrode portion 122 in parallel to the control side 160AC and second measurement side 160A2 toward the −X-direction side, and is connected to the board-side ground terminal 154G. That is, the fourth ground electrode portion 124 included in the ground electrode 120L1 may extend from an intermediate point of the second ground electrode portion 122 in parallel to the control side 160AC and second measurement side 160A2 toward between third circuit-side measurement terminals 163 and fourth circuit-side measurement terminals 164, and may be connected to the circuit-side ground terminal 164G, which is one of a plurality of circuit-side ground terminals, between third circuit-side measurement terminals 163 and fourth circuit-side measurement terminals 164.

<Structures of the First Shield Portion 131 to the Fourth Shield Portion 134>

The first shield portion 131 to the fourth shield portion 134 may be respectively placed closer to the center of the measurement IC chip 160 than are the first board-side measurement terminals 151 to fourth board-side measurement terminals 154 in plan view, in correspondence to the first board-side measurement terminals 151 to the fourth board-side measurement terminals 154. The first shield portion 131 to the fourth shield portion 134 extend from portions outside the area A, the portions being part of the active shield electrode 130L1, toward the area A, and are positioned in the area A. That is, the first shield portion 131 to the fourth shield portion 134 are positioned immediately below the measurement IC chip 160.

As for the circuits in the measurement IC chip 160, an output from the alternate-current signal source 172, an input to and an output from the amplitude adjustment unit 173, an input to and an output from the charge amplifier 171, and an input to the ADC 174 have alternate-current components that are the same as alternate-current components supplied to the sensor electrode 110. Therefore, the same alternate-current component is included in a voltage applied to some circuits in the measurement IC chip 160 and voltages applied to the first shield portion 131 to the fourth shield portion 134. The first shield portion 131 to the fourth shield portion 134 are provided to shield wires and the like in the measurement IC chip 160 and to suppress parasitic capacitance with respect to a ground potential point.

The measurement IC chip 160 also internally includes circuits to which an alternate-current component is not applied. A feeble current leaks from the first shield portion 131 to the fourth shield portion 134 through a parasitic capacitor into the circuits to which an alternate-current component is not applied. Even when a feeble current flows into the circuits to which an alternate-current component is not applied, however, the operation of these circuits remains unchanged. That is, the measurement IC chip 160 has circuits the measurement precision of which is improved when an alternate-current is applied to the shield and also has circuits that are not affected by the voltage applied to the shield. As a whole, when an alternate-current voltage is applied to the shield facing the measurement IC chip 160, measurement precision is improved. In the measurement IC chip 160, the first ground electrode portion 121, to which an alternate-current component is not applied, is placed at the position at which only circuits to which an alternate-current component is not applied are placed.

The first shield portion 131 is disposed between the 16 first board-side measurement terminals 151 and the second ground electrode portion 122 and between the first ground electrode portion 121 and the third ground electrode portion 123. Specifically, the first shield portion 131 may be placed with a spacing between the first shield portion 131 and the 16 first board-side measurement terminals 151, first ground electrode portion 121, second ground electrode portion 122, and third ground electrode portion 123. The first shield portion 131 is connected to the board-side shield terminal 150AS through a through-hole via (not illustrated), the active shield electrode 130L2 included in the L2 layer, and the like.

The second shield portion 132 is disposed inside the 16 second board-side measurement terminals 152, third ground electrode portion 123, and second ground electrode portion 122. Specifically, the second shield portion 132 may be placed with a spacing between the second shield portion 132 and the 16 second board-side measurement terminals 152, third ground electrode portion 123, and second ground electrode portion 122. The second shield portion 132 is connected to the board-side shield terminal 150AS through a portion outside the area A on the +X-direction side, the portion being part of the active shield electrode 130L1.

The third shield portion 133 is disposed inside the 16 third board-side measurement terminals 153, second ground electrode portion 122, and fourth ground electrode portion 124. Specifically, the third shield portion 133 may be placed with a spacing between the third shield portion 133 and the 16 third board-side measurement terminals 153, second ground electrode portion 122, and fourth ground electrode portion 124. The third shield portion 133 is connected to the board-side shield terminal 150AS through a portion outside the area A on the −X-direction side, a portion outside the area A on the +Y-direction side, and a portion outside the area A on the +X-direction side, these portions being part of the active shield electrode 130L1.

The fourth shield portion 134 is disposed between the 16 fourth board-side measurement terminals 154 and the second ground electrode portion 122 and between the first ground electrode portion 121 and the fourth ground electrode portion 124. Specifically, the fourth shield portion 134 may be placed with a spacing between the fourth shield portion 134 and the 16 fourth board-side measurement terminals 154, first ground electrode portion 121, second ground electrode portion 122, and fourth ground electrode portion 124. The fourth shield portion 134 is connected to the board-side shield terminal 150AS through a through-hole via (not illustrated), the active shield electrode 130L2 included in the L2 layer, and the like.

The capacitance measurement circuit module 100 has: the multi-layer circuit board 50; the sensor electrode 110 for use for input detection, the sensor electrode 110 being disposed on the multi-layer circuit board 50; the active shield electrode 115 (sensor-side shield electrode) that shields the sensor electrode 110, the active shield electrode 115 being disposed on the multi-layer circuit board 50; board-side measurement terminals (151 to 154) connected to the sensor electrode 110, the board-side measurement terminals being disposed on the multi-layer circuit board 50; the board-side shield terminal 150AS connected to the active shield electrode 115 (sensor-side shield electrode), the board-side shield terminal 150AS being disposed on the multi-layer circuit board 50; the measurement IC chip 160 having circuit-side measurement terminals (161 to 164) connected to the board-side measurement terminals (151 to 154) and also having the circuit-side shield terminal 160AS connected to the board-side shield terminal 150AS, the measurement IC chip 160 outputting measurement signals from the circuit-side measurement terminals (161 to 164) and also outputting a shield signal having the same frequency and the same phase as the measurement signals from the circuit-side shield terminal 160AS, the measurement IC chip 160 being disposed on the multi-layer circuit board 50, the measurement IC chip 160 measuring capacitance of the sensor electrode 110; and the active shield electrode 130L1 (circuit-side shield electrode) disposed at a position, on the multi-layer circuit board 50, at which the active shield electrode 130L1 faces the measurement IC chip 160 and is adjacent to the board-side measurement terminals (151 to 154), the active shield electrode 130L1 being connected to the board-side shield terminal 150AS.

Therefore, it is possible to use the active shield electrode 130L1 (circuit-side shield electrode) to reduce the effect of noise or parasitic capacitance on the board-side measurement terminals (151 to 154) and to reduce the effect of noise or parasitic capacitance on wires or the like included in the measurement IC chip 160.

Therefore, it is possible to provide the capacitance measurement circuit module 100 that can more reliably reduce the effect of noise. It is also possible to improve precision with which the measurement IC chip 160 measures, for example, the position of a manipulation by a support body such as a hand.

The capacitance measurement circuit module 100 may further include the ground electrode 120L1 disposed on the multi-layer circuit board 50. The measurement IC chip 160 may have a plurality of circuit-side ground terminals (161G to 164G) connected to the ground electrode 120L1, and may also include a plurality of circuit-side measurement terminals (161 to 164). Adjacent to each of the plurality of circuit-side measurement terminals (161 to 164), any another one of the plurality of circuit-side measurement terminals (161 to 164) or any one of the plurality of circuit-side ground terminals (161G to 164G) may be positioned. Therefore, a power supply terminal, a control terminal, or the like is not placed adjacent to each of the circuit-side measurement terminals (161 to 164), so measurement precision can be improved with the suppression of crosstalk.

The measurement IC chip 160 may be in a rectangular shape having four sides in plan view. The measurement IC chip 160 may further have a power supply terminal connected to a power supply, an output terminal from which a signal representing a capacitance value is output, and a control terminal to which or from which a digital signal is input or output. Three of the four sides are measurement sides (first measurement side 160A1 to third measurement side 160A3), at which the plurality of circuit-side measurement terminals (161 to 164), the circuit-side shield terminal 160AS, and some of the plurality of circuit-side ground terminals (161G to 164G) may be disposed. A side of the four sides other than the three measurement sides (first measurement side 160A1 to third measurement side 160A3) is the control side 160AC, at which power supply terminal, an output terminal, a control terminal, and at least one circuit-side ground terminal (161G, 162G, 163G, or 164G) of the plurality of circuit-side ground terminals (161G to 164G) may be disposed. The first ground electrode portion 121 included in the ground electrode 120L1 may extend along the control side 160AC, at a position, on the multi-layer circuit board 50, at which the first ground electrode portion 121 faces the measurement IC chip 160. Since the first ground electrode portion 121 is provided along the control side 160AC, at which a power supply terminal, an output terminal, a control terminal, and at least one circuit-side ground terminal are disposed, the operation of the measurement IC chip 160 is stabilized, making it possible to improve measurement precision.

The plurality of circuit-side measurement terminals (161 to 164) may be classified into a first circuit-side measurement terminal group (161), a second circuit-side measurement terminal group (162), a third circuit-side measurement terminal group (163), and a fourth circuit-side measurement terminal group (164). The measurement IC chip 160 may output measurement signals to the first circuit-side measurement terminal group (161), second circuit-side measurement terminal group (162), third circuit-side measurement terminal group (163), and fourth circuit-side measurement terminal group (164) from the circuit-side measurement terminals (161 to 164) at different times, and may output these measurement signals to a plurality of circuit-side measurement terminals (161 to 164) included in each group at the same time. The three measurement sides (first measurement side 160A1 to third measurement side 160A3) may be the first measurement side 160A1 adjacent to the control side 160AC, the second measurement side 160A2 adjacent to the first measurement side 160A1, and the third measurement side 160A3 adjacent to the second measurement side 160A2 and control side 160AC.

The first circuit-side measurement terminal group (161) may be disposed at the first measurement side 160A1. The second circuit-side measurement terminal group (162) may be disposed from the first measurement side 160A1 to the second measurement side 160A2. The third circuit-side measurement terminal group (163) may be disposed from the second measurement side 160A2 to the third measurement side 160A3. The fourth circuit-side measurement terminal group (164) may be disposed at the third measurement side 160A3. The circuit-side shield terminal 160AS may be disposed at an end of the first measurement side 160A1 on the same side as the control side 160AC.

The plurality of circuit-side ground terminals (161G to 164G) may be disposed between the first circuit-side measurement terminal group (161) and the second circuit-side measurement terminal group (162), between the second circuit-side measurement terminal group (162) and the third circuit-side measurement terminal group (163), and between the third circuit-side measurement terminal group (163) and the fourth circuit-side measurement terminal group (164).

The second ground electrode portion 122 included in the ground electrode 120L1 may extend from the first ground electrode portion 121 in parallel to the first measurement side 160A1 and third measurement side 160A3 toward between the second circuit-side measurement terminal group (162) and the third circuit-side measurement terminal group (163), and may be connected to the circuit-side ground terminal 162G, which is one of the plurality of circuit-side ground terminals (161G to 164G), between the second circuit-side measurement terminal group (162) and the third circuit-side measurement terminal group (163).

The third ground electrode portion 123 included in the ground electrode 120L1 may extend from the second ground electrode portion 122 in parallel to the control side 160AC and second measurement side 160A2 toward between the first circuit-side measurement terminal group (161) and the second circuit-side measurement terminal group (162), and may be connected to the circuit-side ground terminal 163G, which is one of the plurality of circuit-side ground terminals (161G to 164G), between the first circuit-side measurement terminals (161) and the second circuit-side measurement terminal group (162).

The fourth ground electrode portion 124 included in the ground electrode 120L1 may extend from the second ground electrode portion 122 in parallel to the control side 160AC and second measurement side 160A2 toward between the third circuit-side measurement terminal group (163) and the fourth circuit-side measurement terminal group (164), and may be connected to the circuit-side ground terminal 164G, which is one of the plurality of circuit-side ground terminals (161G to 164G), between the third circuit-side measurement terminal group (163) and the fourth circuit-side measurement terminal group (164).

The active shield electrode 130L1 (circuit-side shield electrode) may be disposed with a predetermined spacing between the active shield electrode 130L1 and the first ground electrode portion 121, second ground electrode portion 122, third ground electrode portion 123 and fourth ground electrode portion 124. Since the active shield electrode 130L1 (circuit-side shield electrode) is disposed next to the first ground electrode portion 121 to the fourth ground electrode portion 124 with a spacing between these ground electrode portions and the active shield electrode 130L1 as described above, crosstalk can be reduced with the suppression of mutual effects on the first circuit-side measurement terminal group (161) to the fourth circuit-side measurement terminal group (164). Therefore, it is possible to provide the capacitance measurement circuit module 100 that achieves both the reduction of the effects of noise and parasitic capacitance on the board-side measurement terminals (151 to 154) and on wires and the like included in the measurement IC chip 160 and the reduction of crosstalk at the first circuit-side measurement terminal group (161) to the fourth circuit-side measurement terminal group (164).

The board-side measurement terminals (151 to 154) may be classified into a first board-side measurement terminal group (151), a second board-side measurement terminal group (152), a third board-side measurement terminal group (153), and a fourth board-side measurement terminal group (154) in correspondence to the first circuit-side measurement terminal group (161), second circuit-side measurement terminal group (162), third circuit-side measurement terminal group (163), and fourth circuit-side measurement terminal group (164). The active shield electrode 130L1 (circuit-side shield electrode) may have the first shield portion 131, second shield portion 132, third shield portion 133, and fourth shield portion 134, which are disposed with a predetermined spacing between these shield portions and the first ground electrode portion 121, second ground electrode portion 122, third ground electrode portion 123, and fourth ground electrode portion 124. The first shield portion 131, second shield portion 132, third shield portion 133, and fourth shield portion 134 may be placed in correspondence to the first board-side measurement terminal group (151), second board-side measurement terminal group (152), third board-side measurement terminal group (153), and fourth board-side measurement terminal group (154). Therefore, it is possible to provide the capacitance measurement circuit module 100 that can use the first shield portion 131 to the fourth shield portion 134 to more effectively reduce the effects of noise and parasitic capacitance on the board-side measurement terminals (151 to 154) and on wires and the like included in the measurement IC chip 160 and can further improve measurement precision.

This completes the description of the capacitance measurement circuit module in an exemplary embodiment of the present disclosure. However, the present disclosure is not limited to specifically disclosed embodiments, but can be varied and modified in various other ways without departing from the scope of the claims.

What is claimed is:

1. A circuit module for measuring capacitance, comprising:
   a wiring board having a first surface and a second surface opposite to the first surface;
   a sensor electrode disposed on the first surface of the wiring board and configured to detect a change in capacitance;
   a sensor-side shield electrode disposed on the first surface and configured to shield the sensor electrode;
   at least one board-side measurement terminal disposed on the second surface and connected to the sensor electrode via the wiring board;
   a board-side shield terminal disposed on the second surface and connected to the sensor-side shield electrode via the wiring board;
   a circuit-side shield electrode disposed on the second surface, adjacent to the board-side measurement terminal, and connected to the board-side shield terminal; and
   a measurement integrated circuit (IC) provided on the second surface so as to overlap a portion of the circuit-side shield electrode in plan view from a direction normal to the second surface, the measurement IC including:
      at least one circuit-side measurement terminal connected to the at least one board-side measurement terminal; and
      a circuit-side shield terminal connected to the board-side shield terminal,
   wherein the measurement IC is configured to measure capacitance of the sensor electrode, by outputting a measurement signal from the at least one circuit-side measurement terminal and a shield signal from the circuit-side shield terminal, the shield signal having a frequency and a phase which are the same as that of the measurement signal.

2. The circuit module according to claim 1, further comprising:
   a ground electrode disposed on the second surface of the wiring board and adjacent to the circuit-side shield electrode, wherein the measurement IC further includes:
a plurality of circuit-side ground terminals connected to the ground electrode; and
a plurality of circuit-side measurement terminals, each of which is positioned adjacent to another of the plurality of circuit-side measurement terminals or one of the plurality of circuit-side ground terminals.

3. The circuit module according to claim 2,
wherein the measurement IC is in a rectangular shape in the plan view and having four sides which are a control side and three measurement sides,
wherein the measurement IC further includes:
a power supply terminal disposed on the control side and connected to a power supply;
an output terminal disposed on the control side, from which a signal representing a capacitance value is output; and
a control terminal disposed on the control side, to and from which a digital signal is input or output,
wherein the plurality of circuit-side measurement terminals, the circuit-side shield terminal, and some of the plurality of circuit-side ground terminals are disposed on the three measurement sides, and at least one of the plurality of circuit-side ground terminals is disposed on the controls side,
and wherein the ground electrode includes a first ground electrode portion extending along the control side and overlapping the measurement IC in the plan view.

4. The circuit module according to claim 3,
wherein the plurality of circuit-side measurement terminals are divided into four circuit-side terminal groups and arranged on the three measurement sides of the measurement IC, such that a first circuit-side terminal group is disposed on a first measurement side, a second circuit-side terminal group is disposed on the first measurement side and a second measurement side adjacent to the first measurement side, a third circuit-side terminal group is disposed on the second measurement side and a third measurement side adjacent to the second measurement side, and a fourth circuit-side terminal group is disposed on the third measurement side, the control side being opposite to the second measurement side and adjacent to the first and third measurement side,
wherein the measurement IC is further configured to output the measurement signal from the plurality of circuit-side measurement terminals group by group such that the four circuit-side terminal groups output the measurement signal at different times, while the circuit-side measurement terminals in a same group output the measurement signal at a same time,
wherein the circuit-side shield terminal is disposed at an end of the first measurement side adjacent to the control side, and the plurality circuit-side ground terminals are disposed between the first circuit-side terminal group and the second circuit-side terminal group on the first measurement side, between the second circuit-side terminal group and the third circuit-side terminal group on the second measurement side, and between the third circuit-side terminal group and the fourth circuit-side terminal group on the third measurement side,
wherein the ground electrode further includes:
a second ground electrode portion extending from the first ground electrode portion in parallel to and between the first measurement side and the third measurement side toward the second measurement side and connected to the circuit-side ground terminal disposed between the second circuit-side terminal group and the third circuit-side terminal group on the second measurement side;
a third ground electrode portion extending from the second ground electrode portion in parallel to and between the control side and the second measurement side toward the first measurement side and connected to the circuit-side ground terminal disposed between the first circuit-side terminal group and the second circuit-side terminal group on the first measurement side; and
a fourth ground electrode portion extending from the second ground electrode portion in parallel to and between the control side and the second measurement side toward the third measurement side and connected to the circuit-side ground terminal disposed between the third circuit-side terminal group and the fourth circuit-side terminal group on the third measurement side,
and wherein the circuit-side shield electrode is disposed to have a predetermined spacing from the first ground electrode portion, the second ground electrode portion and the third ground electrode portion, and the fourth ground electrode portion, respectively, in the plan view.

5. The circuit module according to claim 4,
wherein the board-side measurement terminals are divided into four board-side terminal groups and arranged correspondingly to the four circuit-side terminal groups,
wherein the circuit-side shield electrode includes:
a first shield portion disposed in a space between the first ground electrode portion and third ground electrode portion along the second ground electrode portion and arranged for a first board-side terminal group corresponding to the first circuit-side terminal group on the first measurement side;
a second shield portion disposed in a corner space between the second ground electrode portion and the third ground electrode portion and arranged for a second board-side terminal group corresponding to the second circuit-side terminal group on the first and second measurement sides;
a third shield portion disposed in a corner space between the second ground electrode portion and the fourth ground electrode portion and arranged for a third board-side terminal group corresponding to the third circuit-side terminal group on the second and third measurement sides; and
a fourth shield portion disposed in a space between the first ground electrode portion and the fourth ground electrode portion along the second ground electrode portion and arranged for a fourth board-side terminal group corresponding to the fourth circuit side terminal group on the third measurement side.

* * * * *